(12) United States Patent
Beny

(10) Patent No.: US 8,213,143 B2
(45) Date of Patent: Jul. 3, 2012

(54) CIRCUIT ARRANGEMENT FOR THE PROTECTION OF ELECTRONIC COMPONENTS OR ASSEMBLIES

(75) Inventor: Frank Beny, Paderborn (DE)

(73) Assignee: DSPACE Digital Signal Processing and Control Engineering GmbH, Paderborn (DE)

( * ) Notice: Subject to any disclaimer, the term of this patent is extended or adjusted under 35 U.S.C. 154(b) by 972 days.

(21) Appl. No.: 12/183,801

(22) Filed: Jul. 31, 2008

(65) Prior Publication Data
US 2009/0052103 A1 Feb. 26, 2009

(30) Foreign Application Priority Data
Aug. 2, 2007 (DE) .................. 10 2007 036 618

(51) Int. Cl.
*H02H 9/00* (2006.01)
(52) U.S. Cl. ........................................ 361/58
(58) Field of Classification Search ................. 361/58
See application file for complete search history.

(56) References Cited

U.S. PATENT DOCUMENTS

| | | | |
|---|---|---|---|
| 5,410,441 A | 4/1995 | Allman | |
| 5,548,467 A | 8/1996 | Heaney et al. | |
| 6,031,705 A | 2/2000 | Gscheidle et al. | |
| 6,590,755 B1 | 7/2003 | Behr et al. | |
| 7,861,103 B2* | 12/2010 | Buterbaugh et al. | 713/340 |
| 2001/0021091 A1 | 9/2001 | Weichler | |
| 2006/0120000 A1 | 6/2006 | Fiesoli et al. | |
| 2008/0319585 A1* | 12/2008 | Nickerson et al. | 700/284 |
| 2011/0141648 A1* | 6/2011 | Sexton et al. | 361/170 |
| 2011/0310521 A1* | 12/2011 | Dauer et al. | 361/102 |
| 2012/0026630 A1* | 2/2012 | Sutherland | 361/35 |
| 2012/0032519 A1* | 2/2012 | Watts | 307/99 |

FOREIGN PATENT DOCUMENTS

| | | |
|---|---|---|
| DE | 8812958 | 2/1990 |
| DE | 19728783 | 1/1999 |
| DE | 19743238 | 4/1999 |
| DE | 19743997 | 4/1999 |
| DE | 19923569 | 11/2000 |
| DE | 19964097 | 7/2001 |

(Continued)

OTHER PUBLICATIONS

German Search Report for German Patent No. 10 2007 036 618.5 mailed on Jun. 13, 2008.

*Primary Examiner* — Ronald W Leja
(74) *Attorney, Agent, or Firm* — Leydig, Voit & Mayer, Ltd.

(57) ABSTRACT

A circuit arrangement for protecting an electronic device from damage upon a fault. The circuit arrangement includes at least one first terminal, at least one second terminal, a first interface and a second interface, a fault detection circuit region, a fault signal processing circuit region, and a disconnection circuit region. The at least one first terminal is coupled to the at least one second terminal in a fault-free state, the fault detection circuit region is coupled to the fault signal processing circuit region, the fault signal processing circuit region is coupled to the disconnection circuit region, the disconnection circuit region is configured to disconnect at least one of the at least one first terminal and the at least one second terminal, and the fault detection circuit region, the first and second interfaces, and the disconnection circuit region are configured to be compatible with another different fault signal processing circuit region.

24 Claims, 2 Drawing Sheets

FOREIGN PATENT DOCUMENTS

| | | |
|---|---|---|
| DE | 102004046810 | 4/2006 |
| DE | 102005003682 | 8/2006 |
| DE | 102006006878 | 7/2007 |
| EP | 1267465 | 12/2002 |
| GB | 2302624 | 1/1997 |
| WO | 0074196 | 12/2000 |
| WO | 2006079422 | 8/2006 |
| WO | 2007096219 | 8/2007 |

* cited by examiner

CIRCUIT ARRANGEMENT FOR THE PROTECTION OF ELECTRONIC COMPONENTS OR ASSEMBLIES

CROSS REFERENCE TO PRIOR APPLICATIONS

Priority is claimed to German Patent Application DE 10 2007 036 618.5, filed Aug. 2, 2007, the entire disclosure of which is incorporated by reference herein.

FIELD

The present invention relates to a circuit arrangement for protecting one or more electronic constituents, components, or assemblies from damage or destruction in the context of faults due to excessive currents or excessive voltages.

BACKGROUND

Various types of protective circuit arrangements exist. For example, circuit arrangements for the protection of constituents, components, or assemblies that are based on the principle of current limiting. In other words, when a maximum current is reached, provision is made that said current is not exceeded over the long term. This can be implemented, for example, by switching field effect transistors into the current path, the gates of said transistors being discharged to the extent that the current is not exceeded. Depending on the current intensity, the power dissipation of the field effect transistors in this context can be substantial.

Another type of protective circuit arrangement includes a temperature-dependent resistors whose response behaviors depend on the ambient temperature. For working ranges of the temperature-dependent resistors from, for example, −40° C. to +85° C., however, a protective circuit arrangement dimensioned for +85° C. is practically ineffective at −40° C. In addition, the response time of such circuits can be on the order of seconds, which does not provide rapidly effective protection. The time required for the protective circuit arrangement to become effective can be sufficiently long that the constituent, component, or assembly to be protected is already destroyed.

SUMMARY

An aspect of the present invention is to provide a protective circuit arrangement that on the one hand can be used even in environments having large temperature fluctuations, has a quick reaction in order to provide rapidly effective protection, is continuously effective, and does not itself run the risk of being damaged or destroyed by overvoltage or overcurrent. In addition, the circuit arrangement is to be capable of being adapted as easily as possible to various intended applications.

In an embodiment, the present invention provides a circuit arrangement for protecting an electronic device from damage due from at least one of excessive current and excessive voltage upon a fault. The circuit arrangement includes at least one first terminal associated with the electronic device, at least one second terminal associated with the electronic device, a first interface and a second interface, a fault detection circuit region configured to detect the fault and generate a fault signal indicating the fault, a fault signal processing circuit region configured to process or forward the fault signal and generate a disconnection signal, and a disconnection circuit region configured to disconnect the electronic device from a fault source based on the disconnection signal. In a fault-free state, the at least one first terminal is coupled to the at least one second terminal. The fault detection circuit region is coupled to the fault signal processing circuit region via the first interface. The fault signal processing circuit region is coupled to the disconnection circuit region via the second interface. The disconnection circuit region is configured to disconnect at least one of the at least one first terminal and the at least one second terminal. The fault detection circuit region, the first and second interfaces, and the disconnection circuit region are configured to be compatible with another different fault signal processing circuit region.

BRIEF DESCRIPTION OF THE DRAWINGS

Two exemplifying embodiments of circuit arrangements according to the present invention for protecting one or more electronic constituents, components, or assemblies from damage or destruction in the event of faults due to excessive currents or excessive voltages are described further in the attached drawings, in which.

DETAILED DESCRIPTION

Figure 1:
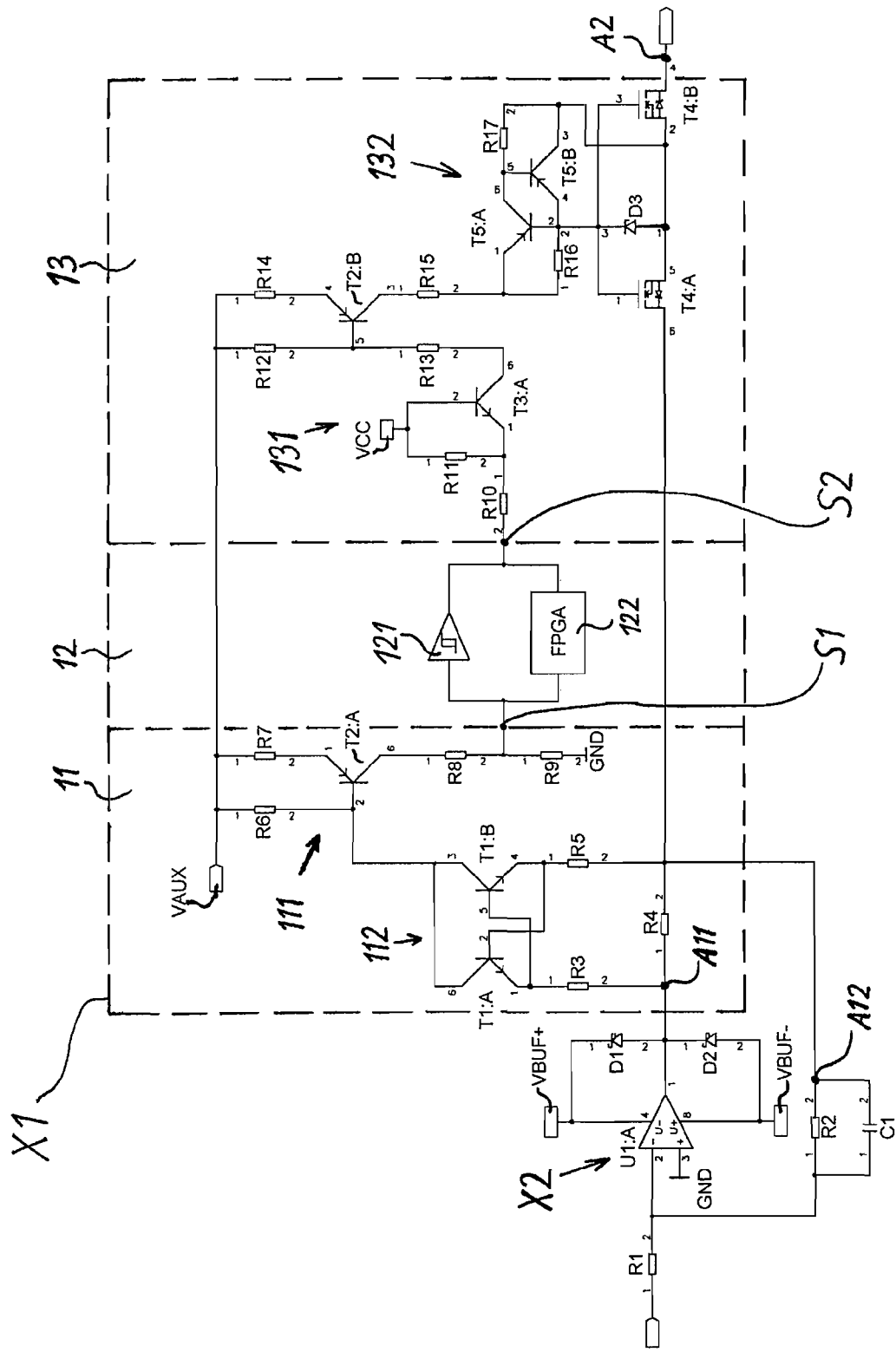
FIG. 1 shows a first exemplifying embodiment of a protective wiring arrangement for protecting an output of an operational amplifier circuit in accordance with an embodiment of the present invention.

An embodiment of a protective circuit arrangement according to the present invention includes one or more first terminals for one or more constituents, components, or assemblies to be protected. The circuit arrangement furthermore includes one or more second terminals for one or more constituents, components, or assemblies that are a possible fault source.

The circuit arrangement encompasses a circuit region for detecting a fault and for generating a fault signal indicating the fault, which region is referred to hereinafter as a fault detection region. A further circuit region is provided for processing or forwarding of the fault signal, and for generation of a disconnection signal. This region of the circuit arrangement is referred to hereinafter as a fault signal processing region. The circuit arrangement includes a third circuit region that is provided for disconnecting from the fault source, on the basis of the disconnection signal, the electronic constituents, components, or assemblies to be protected. This region of the circuit arrangement is referred to hereinafter as a disconnection region.

A first terminal and a second terminal of the circuit arrangement are, according to an aspect of the present invention, interconnected. The fault detection region and the fault signal processing region are interconnected via a first interface, so that the fault signal can be transferred from the fault detection region to the fault signal processing region. The fault signal processing region and the disconnection region are likewise interconnected via an interface, namely via a second interface. By way of this second interface, the disconnection signal can be transferred from the fault signal processing region, in which the fault signal is generated, to the disconnection region.

The disconnection region of a protective circuit arrangement according to the present invention is suitable and equipped for disconnecting from one another the interconnected first terminal and second terminal.

The fault detection region of a circuit arrangement according to an aspect of the present invention, as well as the first interface, the second interface, and the disconnection region of a protective circuit arrangement according to the present invention, are suitable and equipped to be able to coact with differently configured fault signal processing regions. The circuit arrangement can thus be adapted flexibly to the requirements of the field of application.

The fault detection region of a protective circuit arrangement according to an aspect of the present invention can include, before the first interface, circuitry for adapting the level of the fault signal. The disconnection region can likewise include circuitry, attaching to the second interface, for adapting the level of the disconnection signal. These circuits for level adaptation can include transistors that operate or are connected as level converters.

The fault signal processing region can encompass an operational amplifier circuit, in particular a hysteresis circuit, for example a Schmitt trigger, or can be constituted by such a circuit. The fault signal processing region can encompass an integrated circuit or can be constituted by such an integrated circuit. The integrated circuit can be a programmable logic circuit (FPGA). The fault signal processing region can be suitable and equipped for delaying the forwarding of the fault signal and/or the resetting (i.e. cancellation) of the fault signal from the first interface (first interface as connection between fault detection region and fault processing region) to the second interface (second interface as connection between fault signal processing region and disconnection region). The fault signal processing region can encompass, if necessary, circuitry for defining constant or adjustable delay times for the aforesaid delayed forwarding of the fault signal and/or for the aforesaid delayed resetting of the fault signal.

The fault signal processing region can include a circuit for control that is constituted, for example, by the operational amplifier circuit or by an integrated circuit. The circuit for control can furthermore also encompass a microprocessor or can be constituted by a microprocessor. It is additionally possible for the circuit for control to include elements for manual operation by a user, so that a user can influence the generation of the fault signal or the resetting of the circuit arrangement to fault-free operation. The fault signal processing region can also be suitable and equipped for passing the fault signal through from the first interface to the second interface.

The fault signal processing region can include a circuit for indicating the fault signal, with which the occurrence of an overvoltage or of an overcurrent can be indicated to a user. In a simple case, an indicating means of this kind can be a light-emitting diode that illuminates in the event of a fault.

The protective wiring arrangement can be suitable and equipped for being operated when the first terminal is connected to one or more constituents, components, or assemblies that are a possible fault source, and the second terminal is connected to one or more constituents, components, or assemblies to be protected.

According to an embodiment of the present invention, the fault detection region can include a current sensor or voltage sensor, for example having a measuring resistor, in particular having an ohmic resistor, that is connected between the first terminal and the second terminal.

Protective wiring arrangement X1 depicted in FIG. 1 serves to protect the output of operational amplifier circuit X2. Operational amplifier circuit X2 is selected by way of example, and can be replaced by any other operational amplifier circuit or circuit arrangement.

The operational amplifier circuit is a first-order low-pass filter having an inverting amplifier. Active first-order low-pass filters of this kind are sufficiently known from the existing art. Reference may be made, by way of example, to U. Tietze, Ch. Schenk, "Halbleiterschaltungstechnik" [Semiconductor circuit engineering]. The constituents of the active low-pass filter, namely resistors R1 and R2 as well as capacitor C1 and operational amplifier U1:A, are interconnected as shown. Schottky diodes D1 and D2 serve to limit the voltage at the terminals of operational amplifier U1:A to the operating voltage in a fault situation in which the output of operational amplifier circuit X2 has too high a voltage applied to it.

The purpose of Schottky diodes D1 and D2 is to dissipate brief overvoltages. Schottky diodes D1, D2 are, however, not designed for continuous loading. Protective wiring arrangement X1 is therefore preferable for continuous protection of the output of the operational amplifier circuit.

Protective wiring arrangement X1 includes one first terminal A11 that is connected to the output of the operational amplifier circuit. A further first terminal A12, by way of which the protective wiring arrangement is likewise connected to operational amplifier circuit 12, is significant for feedback of the output of the operational amplifier. This further first terminal A12 is, however, not protected in the same fashion by the protective circuit arrangement.

Protective circuit arrangement X1 includes, in addition to the two first terminals A11 and A12, a second terminal A2 at which the circuit to be controlled by operational amplifier circuit X2 is connected. In the fault-free state, the output signal of operational amplifier circuit X2 is looped through, substantially uninfluenced by protective circuit arrangement X1, to terminal A2.

The circuit downstream from terminal A2 can be a source of an overcurrent that is impressed via terminal A1 upon operational amplifier circuit X2. An overcurrent of this kind can result in damage to operational amplifier circuit X2 and in particular to operational amplifier U1:A, if protective circuit arrangement X1 were not interposed.

Protective circuit arrangement X1 includes a circuit region for detecting a fault and for generating a fault signal indicating the fault. This circuit region is referred to hereinafter as fault detection region 11.

In addition to the fault detection region, circuit arrangement X1 includes a circuit region for processing the fault signal and for generating a disconnection signal. This circuit region is referred to hereinafter as fault signal processing region 12.

Lastly, protective circuit arrangement X1 includes a third circuit region that is suitable and equipped for disconnecting from the fault source, on the basis of the disconnection signal, the electronic constituents U1:A, components, or assemblies X2 to be protected. This circuit region is hereinafter referred to as disconnection region 13.

Fault detection region 11 includes a circuit 112 for fault detection, and a circuit 111 for adapting the level of the fault signal, which is available at an interface S1 between the fault detection region and fault signal processing region 12.

The circuit 112 for fault detection includes a measuring resistor R4 that is connected between first terminal A11 and second terminal A2 in the signal path of the output signal of operational amplifier X2. With measuring resistor R4, a current between first terminal A11 and terminal A2 can be detected. The circuit for fault detection further includes two NPN transistors T1:A, T1:B, and ohmic resistors R3, R5, R6.

The terminal of measuring resistor R4 that is at the potential of first terminal A11 is connected via resistor R3 to the emitter of transistor T1:A and to the base of transistor T1:B. The terminal of measuring resistor R4 facing toward second terminal A2 is connected via resistor R5 to the emitter of transistor T1:B and to the base of transistor T1:A. The collectors of transistors T1:A, T1:B are interconnected and are thus at the same potential.

The collectors are connected to a first terminal of resistor R6, which is connected at its second terminal to an auxiliary voltage VAUX. The shared node of the collectors of transistors T1:A, T1:B and of the first terminal of resistor R6 forms the connection between the fault detection circuitry and the circuitry 111 for level adaptation.

If the voltage across measuring resistor R4 exceeds a predetermined amount, e.g. 0.6 V, in the event of an overcurrent, either transistor T1:A or transistor T1:B becomes conductive, depending on the direction of the overcurrent. The collector potential, i.e. the potential at the transition point to circuitry 111 for level adaptation, is thereby lowered from the potential of auxiliary voltage VAUX by an amount equal to a potential determined by the ratio of resistors R6, R3 and R6, R5.

The node is connected to a transistor T2:A of the circuitry for level adaptation. The emitter of this PNP transistor T2:A is connected via a resistor R7 to auxiliary voltage VAUX; the collector is connected via a resistor R8 to interface S1 and via a further resistor R9 to ground potential.

As soon as the circuitry 112 for fault detection detects an overvoltage via measuring resistor R4, it causes transistor T2:A of the circuitry 111 for level adaptation to become conductive because of the lowering of the potential at the base of transistor T2:A. The potential at interface S1, which in the fault-free state is at ground potential, is thereby elevated. The fault is thus signaled at interface S1, in the event of a fault, by the elevation in potential. The potential is determined by the voltage divider between resistors R7 and R8 on the one hand, and resistor R9 on the other hand. Transistor T2:A and resistors R7, R8, R9 thus operate as a level converter.

A variant (not depicted in the Figures) of fault detection region 11 can encompass a delay element (e.g. a capacitor) that is integrated into the circuit in such a way that upon occurrence of an overvoltage across measuring resistor R4 (fault state), the potential at interface S1 rises in delayed fashion.

The fault signal that is present, in the event of a fault, at interface S1 between fault detection region 11 and fault signal processing region 12 of protective circuit arrangement X1 according to the present invention is received by the circuit of the fault signal processing region. Fault signal processing region 12 can include a variety of constituents, components, and assemblies. Fault signal processing region 12 can be matched to the application of the protective circuit arrangement.

A hysteresis circuit, in particular a Schmitt trigger 121, or a FPGA 122, can be used, for example, as constituents or assemblies. Assemblies 121 and 122 depicted in FIG. 1 can be used as alternatives to one another. Instead of one of the two assemblies 121, 122, other assemblies, constituents, or components suitable for the intended purpose of the protective circuit arrangement can also be used.

The fault signal available at interface S1 is processed in fault signal processing region 12 of protective circuit arrangement X1; depending on the configuration of the constituents, components, or assemblies with which processing is carried out, a disconnection signal is generated, which signal is nothing other than an instruction to the disconnection region of protective circuit arrangement X1 to disconnect the connection between first terminal A11 and second terminal A2. The disconnection signal is supplied to interface S2 by fault signal processing region 12 of protective circuit arrangement X1, and transferred to disconnection region 13.

A variant (not depicted in the Figures) of fault signal processing region 12 can be configured in such a way that the disconnection signal is additionally delivered to a peripheral circuit (not depicted in the Figures) as a digital status identification signal.

A further variant (not depicted in the Figures) of fault signal processing region 12 can include a link (also not depicted in the Figures) to an external logic circuit; on request (for example in accordance with a user intervention or as a function of a system state of a peripheral system), this external logic circuit delays or suppresses forwarding of the disconnection signal from interface S1 to interface S2.

In disconnection region 13, the disconnection signal is firstly brought, by a circuit 131 for level adaptation, to a signal level that can be processed by disconnection circuit 132. For that purpose, the circuit 131 for level adaptation includes a transistor circuit made up of transistors T2:B and T3:A as well as several resistors R10, R11, R12, R13, R15.

NPN transistor T3:A constitutes, together with resistors R10, R11, a level converter in the base circuit. PNP transistor T2:B constitutes, together with resistors R14, R15, a switched current source.

Disconnection circuitry 132 includes two series-connected field effect transistors T4:A, T4:B having connected source electrodes, which are connected in series with resistor R4 in the conduction path between first terminal A11 and second terminal A2.

During fault-free operation, the purpose of switched current source T2:B, R14, R15 is to charge the gate capacitors of FETs T4:A and T4:B.

A direct application of control to field effect transistors T4:A, T4:B by the disconnection signal after current source T2:B, R14, R15 would be conceivable. The disconnection signal could then be delivered directly to the gate electrodes of field effect transistors T4:A, T4:B. The gate capacitors of field effect transistors T4:A, T4:B would then, however, prevent immediate blocking of field effect transistors T4:A, T4:B. To ensure that the gate capacitors of field effect transistors T4:A, T4:B can be quickly discharged, a circuit layout via two PNP transistors T5:A, T5:B in conjunction with two resistors R16, R17 is therefore provided.

This circuit for abrupt discharge of the gate capacitors of field effect transistors T4:A, T4:B is based on the fact that in the event of a fault, transistor T2:B blocks because of the disconnection signal, and the current through transistor T2:B is switched off. The voltage through resistor R16 thereby collapses, and transistor T5:A blocks. As a result, transistor T5:B receives a base current through resistor R17 and becomes conductive. It is then possible for the gate capacitors of field effect transistors T4:A, T4:B to discharge through transistor T5:B.

A variant (not depicted in FIGS. 1 and 2) of disconnection region 13 in terms of circuit engineering can include, in particular, instead of field effect transistors T4:A and T4:B, one or more switching module(s), in particular bipolar transistor(s) or relay(s) that is/are controlled by the disconnection signal. The nature and parameters of these switching modules in disconnection region 13 can require an adaptation of the circuit and of the constituents in this region 13 in particular.

A Zener diode D3 limits the voltage between the gate electrodes and source electrodes of field effect transistors T4:A, T4:B.

All in all, the protective circuit arrangement is designed so that the connection between first terminal A11 and second terminal A2 can be disconnected within about 100 nanoseconds, or faster.

If, in the exemplifying embodiment according to FIG. 1, substantially only one connecting line or only one Schmitt trigger is interposed between first interface S1 and second interface S2 in fault signal processing region 12, disconnection circuitry 132 will initially block after detection of a fault (e.g. an overvoltage) in fault detection region 11, and thus interrupt the conductive path between first terminal A11 and second terminal A2. The result of this is that in the fault detection region, the fault (e.g. the overvoltage) can no longer be identified, even if said fault continues to be present at second terminal A2. After a subsequent circuit-dependent delay time, which depends in particular on the parameters of current source R14, T2:B, R1 and the gate capacitances of field effect transistors T4:A, T4:B, disconnection circuitry 132 will therefore briefly cancel the interruption in the conductive path between first terminal A11 and second terminal A2 until a fault is once again detected in fault detection region 11 and the above-described procedure then repeats. The cycle, as described here, of periodic blockage by disconnection circuitry 132 represents a so-called auto-retry, i.e. a periodic checking of the fault situation at second terminal A2; elimination of the fault at A2 also causes the periodic blockage by disconnection circuitry 132 to be eliminated.

The exemplifying embodiment depicted in FIG. 1 of the protective wiring protects the output of operational amplifier circuit X2 even if supply voltages VAUX, VCC were to fail. In that case the combined circuit of field effect transistors T4:A and T4:B would block; this would, for example, prevent any overvoltage or interference voltage present at second terminal A2 from traveling to operational amplifier circuit X2.

Figure 2:
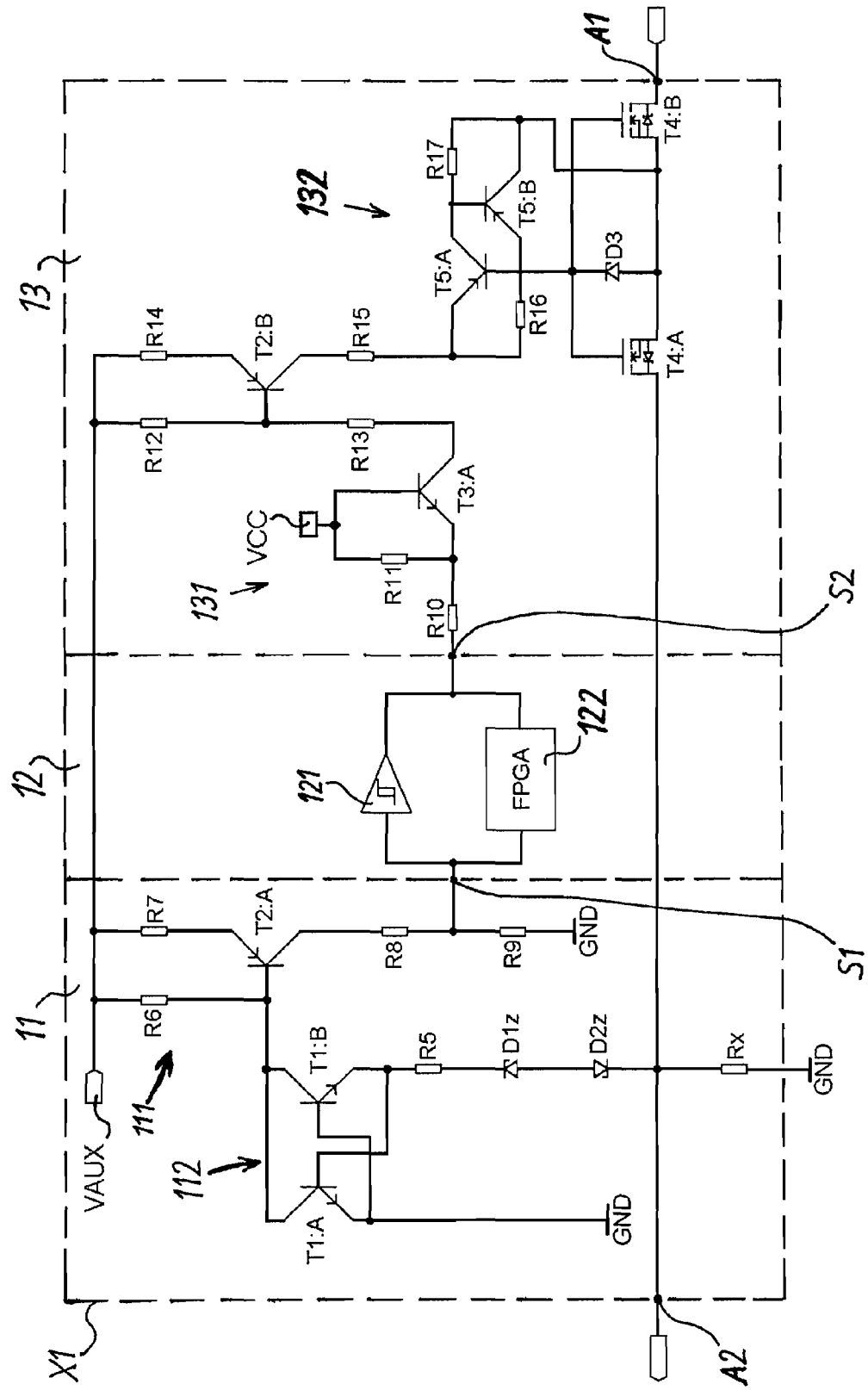
FIG. 2 shows a circuit arrangement for protecting an input of a circuit arrangement in accordance with an embodiment of the present invention.

The exemplifying embodiment depicted in FIG. 2 of a protective circuit arrangement X1 for protecting the input of constituents, components, or assemblies is configured substantially in just the same way as the exemplifying embodiment according to FIG. 1. The difference between the two exemplifying embodiments lies in fault detection region 11. What is to be protected is, for example, a high-impedance input of a measurement system, symbolized by resistance Rx. Fault detection region 11, in particular circuitry 112 for fault detection, is designed to detect an overvoltage at terminal A2. The response voltage of circuitry 112 for fault detection is defined substantially by Zener diodes D1z, D2z. Resistor R5 acts as a current limiter for the base current and emitter current of transistors T1:A and T1:B, respectively.

Fault signal processing region 12 and disconnection region 13 of protective circuit arrangement X1 according to the present invention are, on the other hand, embodied similarly to exemplifying embodiment 1 according to FIG. 1.

Examples of data for electronic components in the exemplifying embodiment according to FIG. 1 (output protection circuit)

| Designation of component in circuit diagram of exemplifying embodiment | Comments regarding component or Characteristic component value or designation of manufacturer or supplier according to a preferred embodiment of the invention | Comments regarding supplier (examples) |
|---|---|---|
| C1 | Concrete parameters of the component depend on the desired transfer function of the operational amplifier | any supplier |
| D1 | BAT54 | Supplier e.g.: ON Semiconductor or ST Microelectronics |
| D2 | BAT54 | Supplier e.g.: ON Semiconductor or ST Microelectronics |
| D3 | BZX84C10L | Supplier e.g.: ON Semiconductor |
| R1 | Concrete parameters of the component depend on the desired transfer function of the operational amplifier | any supplier |
| R2 | Concrete parameters of the component depend on the desired transfer function of the operational amplifier | any supplier |
| R3 | 1 kΩ | any supplier |
| R4 | 33 Ω | any supplier |
| R5 | 1 kΩ | any supplier |
| R6 | 4.7 kΩ | any supplier |
| R7 | 10 kΩ | any supplier |
| R8 | 22 kΩ | any supplier |
| R9 | 22 kΩ | any supplier |
| R10 | 10 kΩ | any supplier |
| R11 | 1 MΩ | any supplier |
| R12 | 22 kΩ | any supplier |
| R13 | 22 kΩ | any supplier |
| R14 | 10 kΩ | any supplier |
| R15 | 15 kΩ | any supplier |
| R16 | 100 kΩ | any supplier |
| R17 | 10 kΩ | any supplier |
| T1: A | BC847B | Supplier: Philips |
| T1: B | BC847B | Supplier: Philips |
| T2: A | BC857B | Supplier: Philips |
| T2: B | BC857B | Supplier: Philips |
| T3: A | BC847B | Supplier: Philips |
| T4: A | BSH114 | Supplier: Philips |
| T4: B | BSH114 | Supplier: Philips |
| U1: A | LT1210 | Supplier: Linear Technology |

The present invention is not limited to the described embodiments; reference should be had to the appended claims.

The invention claimed is:

1. A circuit arrangement for protecting electronic device from damage due at least one of excessive current and excessive voltage upon a fault, the circuit arrangement comprising:
at least one first terminal associated with the electronic device;
at least one second terminal associated with the electronic device;
a first interface and a second interface;
a fault detection circuit region, the fault detection circuit region being configured to detect the fault and generate a fault signal indicating the fault;
a fault signal processing circuit region, the fault signal processing circuit region begin configured to process or forward the fault signal and generate a disconnection signal; and
a disconnection circuit region, the disconnection circuit region being configured to disconnect the electronic device from a fault source based on the disconnection signal, wherein:
in a fault-free state, the at least one first terminal is coupled to the at least one second terminal,
the fault detection circuit region is coupled to the fault signal processing circuit region via the first interface, the fault signal processing circuit region is coupled to the disconnection circuit region via the second interface, the disconnection circuit region is configured to disconnect at least one of the at least one first terminal and the at least one second terminal, and the fault detection circuit region, the first and second interfaces, and the disconnection circuit region are configured to be compatible with another different fault signal processing circuit region.

2. The circuit arrangement as recited in claim 1, wherein the electronic device includes at least one of an electronic constituent, component, and assembly.

3. The circuit arrangement as recited in claim 1, wherein the fault detection circuit region includes a first level adapting circuit configured to adapt a level of the fault signal.

4. The circuit arrangement as recited in claim 3, wherein the disconnection circuit region includes a second level adapting circuit coupled to the second interface configured to adapt a level of the disconnection signal.

5. The circuit arrangement as recited in claim 3, wherein the fault signal processing circuit region includes an operational amplifier circuit.

6. The circuit arrangement as recited in claim 5, wherein the operational amplifier circuit includes a Schmitt trigger.

7. The circuit arrangement as recited in claim 1, wherein the disconnection circuit region includes a second level adapting circuit coupled to the second interface configured to adapt a level of the disconnection signal.

8. The circuit arrangement as recited in claim 7, wherein the fault signal processing circuit region includes an operational amplifier circuit.

9. The circuit arrangement as recited in claim 8, wherein the operational amplifier circuit includes a Schmitt trigger.

10. The circuit arrangement as recited in claim 1, wherein the fault signal processing circuit region includes an operational amplifier circuit.

11. The circuit arrangement as recited in claim 10, wherein the operational amplifier circuit includes a Schmitt trigger.

12. The circuit arrangement as recited in claim 1, wherein the fault signal processing circuit region includes an integrated circuit.

13. The circuit arrangement as recited in claim 12, wherein the integrated circuit is a programmable logic circuit.

14. The circuit arrangement as recited in claim 13, wherein the programmable logic circuit is a field programmable gate array (FPGA).

15. The circuit arrangement as recited in claim 1, wherein the fault signal processing circuit region is configured to delay a forwarding of the fault signal from the first interface to the second interface.

16. The circuit arrangement as recited in claim 1, wherein the fault signal processing circuit region is configured to reset the fault signal from the first interface to the second interface.

17. The circuit arrangement as recited in claim 1, wherein the fault signal processing circuit region includes a control mechanism.

18. The circuit arrangement as recited in claim 17, wherein the control mechanism includes a microprocessor.

19. The circuit arrangement as recited in claim 17, wherein the control mechanism includes a manual user operated control element.

20. The circuit arrangement as recited in claim 19, wherein the manual user operated control element is at least one of a switch, a pushbutton, and a rotary switch.

21. The circuit arrangement as recited in claim 1, wherein the at least one first terminal is coupled to a possible fault source and the at least one second terminal is coupled to the electric device.

22. The circuit arrangement as recited in claim 1, wherein the fault detection circuit region includes at least one of a voltage sensor, a current sensor, and a resistor coupled between the at least one first terminal and the at least one second terminal.

23. The circuit arrangement as recited in claim 1, wherein the disconnection circuit region includes a first series switched field effect transistor having a first source coupled to a second source of a second series switched field effect transistor, wherein the first and second transistors are disposed in a conduction path between the at least one first terminal and the at least one second terminal.

24. The circuit arrangement as recited in claim 23, wherein the first and second series switched field effect transistors each includes a gate with an associated gate capacitance, and wherein the disconnection region includes a circuit configured to abruptly discharge the respective gate capacitances.

* * * * *